United States Patent [19]

Norimatsu

[11] Patent Number: 5,554,892
[45] Date of Patent: Sep. 10, 1996

[54] SIGNAL PROCESSING CIRCUIT FOR SWITCH CAPABLE OF REDUCING INSERTION LOSS

[75] Inventor: Hidehiko Norimatsu, Tokyo, Japan

[73] Assignee: NEC Corproation, Tokyo, Japan

[21] Appl. No.: 233,942

[22] Filed: Apr. 28, 1994

[30] Foreign Application Priority Data

Apr. 28, 1993 [JP] Japan ................................. 5-125513

[51] Int. Cl.⁶ ................................................. H01H 33/59
[52] U.S. Cl. .......................... 307/115; 327/408; 327/355; 327/356; 327/431; 455/135; 455/139; 455/143; 455/150.1
[58] Field of Search ............................ 307/115; 327/431, 327/408, 355, 356; 455/135, 139, 143, 150.1

[56] References Cited

U.S. PATENT DOCUMENTS

| | | | |
|---|---|---|---|
| 3,969,638 | 7/1976 | Marchetti et al. | 327/408 |
| 4,471,289 | 9/1984 | Duley et al. | 323/222 |
| 4,637,073 | 1/1987 | Selin et al. | 455/78 |
| 4,810,911 | 3/1989 | Noguchi | 327/431 |
| 4,920,285 | 4/1990 | Clark et al. | 307/571 |
| 5,054,114 | 10/1991 | Erickson | 455/78 |
| 5,276,914 | 1/1994 | Ishizuka et al. | 455/83 |

FOREIGN PATENT DOCUMENTS 59-8097  5/1984  Japan.

OTHER PUBLICATIONS

Patent Abstracts of Japan, vol. 8, No. 194 (E-264), Sep. 6, 1984.
A. Ezzeddine et al., "A High Isolation DC to 18 GHZ Packaged MMIC SPDT Switch", 18th European Microwave Conference, Sep. 12, 1988, pp. 1028–1033.

Primary Examiner—William M. Shoop, Jr.
Assistant Examiner—Albert W. Paladini
Attorney, Agent, or Firm—Sughrue, Mion, Zinn, Macpeak & Seas

[57] ABSTRACT

A high frequency power amplifier is implemented by a GaAs FET and is supplied with a positive and a negative power supply. The amplifier amplifies the power of an input signal and delivers the amplified signal to a high frequency switch. The high frequency switch is supplied switch control voltages in the form of the positive and negative voltages. Since the switch control voltages are implemented as the positive and negative voltages, a great difference in level between the switch control voltages is achievable which improves insertion loss. While the high frequency switch may also be implemented by GaAs FETs, the insertion loss will be further reduced if the negative voltage is applied to the high frequency switch only during transmission. In this case, current consumption will also be reduced if the generation of the negative voltage is controlled at the negative voltage source side.

17 Claims, 2 Drawing Sheets

FIG. 2a TRANSMISSION TIMING
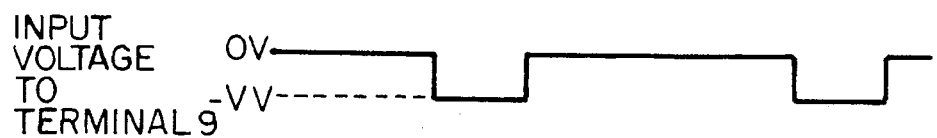
FIG. 2b INPUT VOLTAGE TO TERMINAL 9
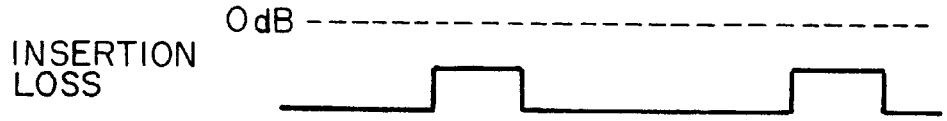
FIG. 2c INSERTION LOSS
FIG. 3
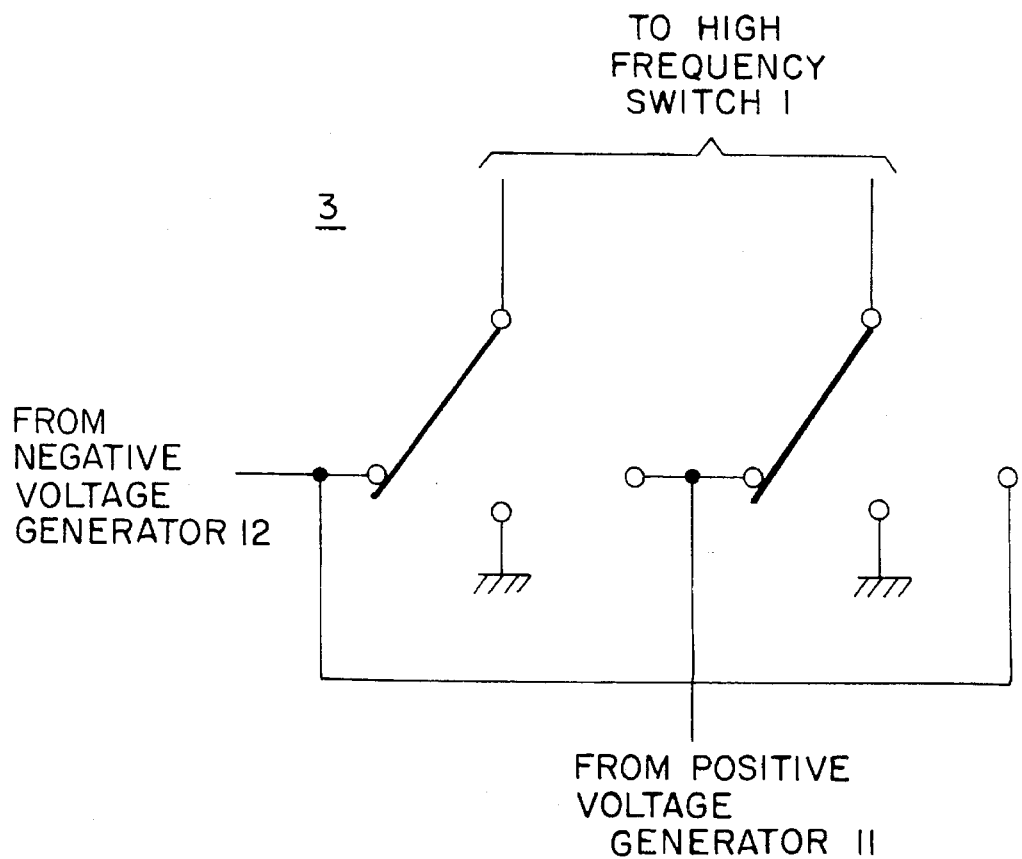

SIGNAL PROCESSING CIRCUIT FOR SWITCH CAPABLE OF REDUCING INSERTION LOSS

BACKGROUND OF THE INVENTION

1. Field of the Invention

The present invention relates to a signal processing circuit for a switch capable of reducing insertion loss and, more particularly, to a signal processing circuit for a switch capable of reducing insertion loss in a portable radio communication apparatus capable of increasing conversation time and of reducing weight.

2. Description of the Related Art

A portable radio communication apparatus needs a high frequency switch capable of switching high frequency signal paths between at least one high frequency power amplifier and antennas, because the portable radio communication apparatus uses an external antenna when it is set in a mobile mode and an internal antenna when it is carried by a person.

In the portable radio communication apparatus, a prerequisite of the high frequency switch is to minimize an insertion loss of the high frequency switch in order to increase conversation time and reduce weight. The minimizing of the insertion loss leads to reducing an output power of the power amplifier. As a result, current consumption is reduced, while conversation time is increased. Moreover, since a high power output is not needed from the power amplifier, a small and light power amplifier is available.

A conventional high frequency switch is implemented by a combination of transistors, diodes or similar semiconductor devices to promote light weight and small size configuration. Such a high frequency switch is described in, for example, Japanese Patent Laid-Open No. 80974/1984 (JP-A-59-80974). This high frequency switch has a gate switch FET implemented by a GaAs FET between a switch FET and a terminating FET to have a small insertion loss and enhanced isolation. The high frequency switch uses a zero voltage and a negative voltage as a high voltage and a low voltage for switch control signals.

Therefore, the use of the high frequency switch described in JP-A-59-80974 has been considered for use in the portable radio communication apparatus in order to achieve small insertion loss. However, in the portable radio communication apparatus, it is difficult to provide a negative voltage generator exclusively for the high frequency switch due to limitations therein, for example, packaging constraints.

SUMMARY OF THE INVENTION

It is therefore an object of the present invention to provide a signal processing circuit for use in a switch in a communication apparatus capable of reducing an insertion loss.

It is another object of the present invention to provide a signal processing circuit for a switch in a communication apparatus capable of reducing its weight.

It is another object of the present invention to provide a portable radio communication apparatus capable of increasing conversation time.

It is a further object of the present invention to provide a portable radio communication apparatus capable of applying a positive voltage and a negative voltage to a high frequency switch without having to provide necessarily a negative voltage generator.

According to the present invention, the inventive signal processing circuit for a switch includes a switch having a plurality of routes to pass a signal and a first controller, to select one of the routes, for supplying a positive voltage and a negative voltage as switch control signals to said switch in response to a control signal.

The inventive signal processing circuit for a switch supplies the negative voltage as switch control signals to the switch during a conversation state, a waiting for transmission state or a communication state, while it supplies a zero voltage instead of the negative voltage to the switch during other states.

BRIEF DESCRIPTION OF THE DRAWINGS

The above and other objects, features and advantages of this invention will become more apparent from the following detailed description taken with the accompanying drawings in which:

FIG. 2 is a timing chart showing the control of supplying a negative or zero voltage to the high frequency switch shown in FIG. 1; and FIG. 3 is a block diagram of another preferred embodiment of the controller shown in FIG. 1.

In the drawings, the same reference numerals denote same structural elements.

DESCRIPTION OF THE PREFERRED EMBODIMENTS

Figure 1:
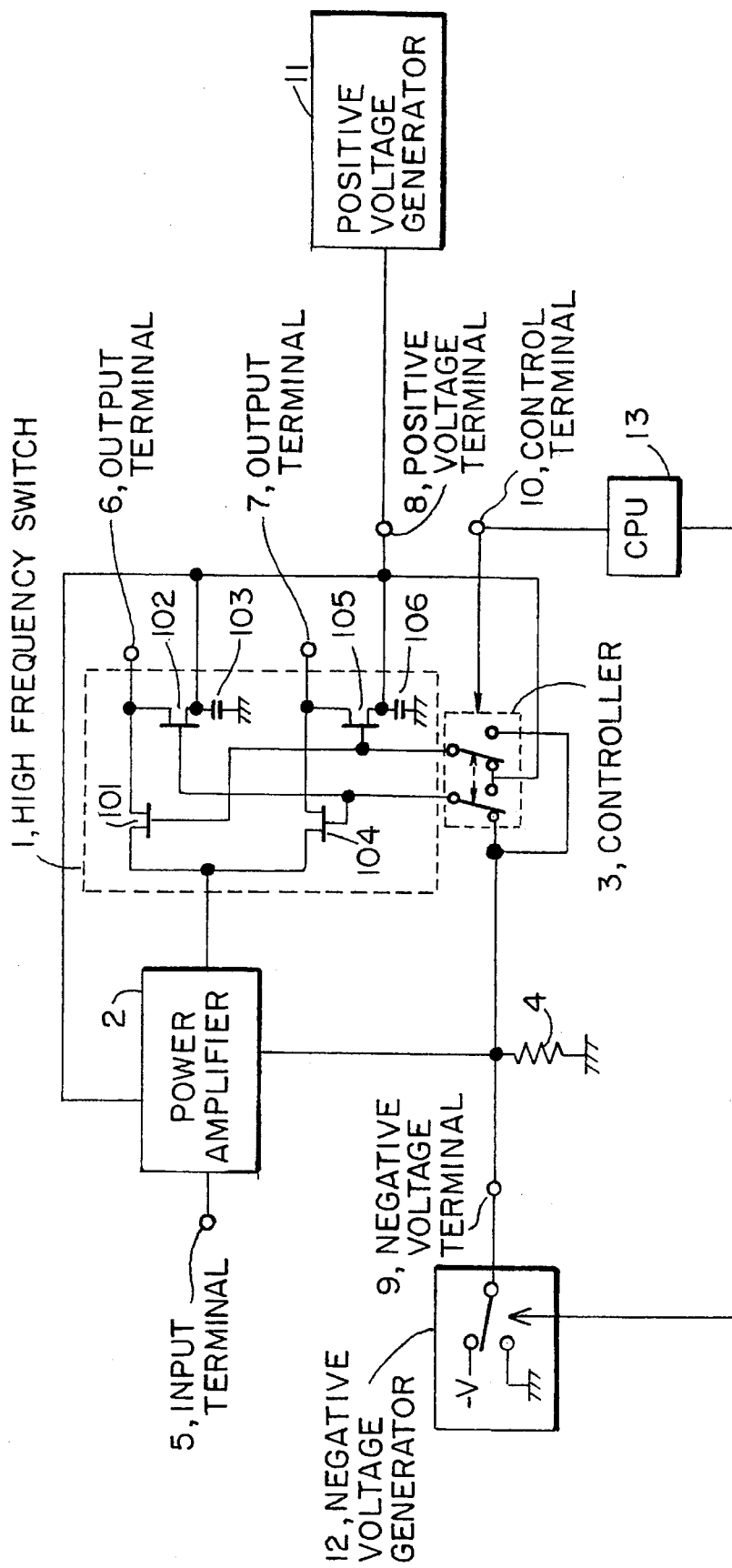
FIG. 1 is a block diagram of a preferred embodiment of a signal processing circuit in a communication apparatus of the present invention.

Now there will be described in detail a preferred embodiment of the present invention with reference to FIGS. 1 to 3.

FIG. 1 is a block diagram of a transmitting portion of a portable radio communication apparatus. In FIG. 1, the portable radio communication apparatus consists of a high frequency switch 1, a high frequency power amplifier 2, a controller 3, a resistor 4, an input terminal 5, output terminals 6 and 7, a positive voltage terminal 8, a negative voltage terminal 9, a control terminal 10, a positive voltage generator 11, a negative voltage generator 12 and a central processing unit (CPU) 13. The high frequency switch 1 consists of transistors 101, 102, 104 and 105 and capacitors 103 and 106.

The positive voltage generator 11 supplies a positive voltage to the positive voltage terminal 8 directly or via a voltage converter (not shown). Likewise, the negative voltage generator 12 for the high frequency power amplifier 2 supplies a negative voltage to the negative voltage terminal 9 directly or via voltage converter (not shown).

The high frequency power amplifier 2 is implemented by a GaAs FET which needs a negative voltage generator. The high frequency power amplifier 2 receives power supply via the positive and negative voltage terminals 8 and 9. The amplifier 2 is supplied with a high frequency transmission signal from the input terminal 5, amplifies the transmission signal to an adequate level and delivers the amplified signal to the high frequency switch 1.

In the high frequency switch 1, the transistors 101, 102, 104 and 105 are GaAs FETs. The GaAs FETs 101 and 104 are switch FETs and the GaAs FETs 102 and 105 are terminating FETs. The positive voltage is supplied to the sources of the FETs 102 and 105 from the positive voltage terminal 8 in order to turn off the FETs 102 and 105 when the positive voltage is supplied to the gates of the FETs 102 and 105 and to turn on the FETs 102 and 105 when the negative voltage is supplied to the gates of the FETs 102 and 105. The sources of the FETs 102 and 105 are connected to ground by the bypass capacitors 103 and 106 respectively, that is, they are not connected to ground with respect to a direct current (DC) but connected to ground with respect to an alternating current (AC). The reason is that the DC is supplied to the sources of the FETs 102 and 105 from the positive voltage terminal 8 and a leak component from the FET 101 or 104 is supplied to ground when the FET 101 or 104 is off, respectively. The positive voltage or negative voltage is supplied to the gates of the FETs 101,102,104 and 105 from the controller 3. Namely, the positive voltage and negative voltage are used as the high voltage and low voltage of the switch control signal, respectively. Therefore, since the difference between the high voltage and low voltage is large, reducing insertion loss and enhancing isolation are achieved.

The controller 3 has switches for supplying the positive or negative voltage to the gates of the FETs 101, 102, 104 and 105 in response to the control signal from the CPU 13 via the control terminal 10. Assume that the switches of the controller 3 are held in the condition shown in FIG. 1. Then, the positive voltage is supplied to the gates of the FETs 101 and 105 of the high frequency switch, thereby turning off the FETs 101 and 105 because the gate voltage of the FETs 101 and 105 is higher than or equal to the source voltage of the FETs 101 and 105, respectively. At the same time, the negative voltage is supplied to the gates of the FETs 102 and 104 to turn them on. As a result, the amplified signal from the high frequency power amplifier 2 is routed through the FET 104 to the output terminal 7. The output terminal 7 is connected to, for example, an internal antenna (not shown) and transmission signals are sent from the output terminal 7 via the internal antenna.

On the other hand, assume that the positive voltage is supplied to the gates of the FETs 102 and 104 of the high frequency switch and the negative voltage is supplied to the gates of the FETs 101 and 105. Then, the FETs 102 and 104 turn off because the gate voltage of the FETs 102 and 104 is higher than or equal to the source voltage of the FETs 102 and 104, respectively. Since the gate voltage of the FETs 101 and 105 is lower than the source of the FETs 101 and 105 respectively, the FETs 101 and 105 turn on. As a result, the amplified signal from the high frequency power amplifier 2 is routed through the FET 101 to the output terminal 6. The output terminal 6 is connected to, for example, an external antenna (not shown) and transmission signals are sent from the output terminal 6 via the external antenna.

As described above, since the negative voltage generator for the high frequency power amplifier and the positive voltage generator supply the negative voltage and the positive voltage, respectively, to the high frequency switch, the difference between the high and Low voltage as the switch control signals is large and insertion loss is decreased.

Next, there will be described the manner in which current consumption is reduced.

FIG. 2 shows a timing chart in the case where the current consumption is reduced. Assume that, transmission occurs in time zones indicated by hatching in FIG. 2(a). The CPU 13 controls, in response to a determined transmission timing, the negative voltage generator 11 to generate the negative voltage (−V) in the hatched time zones and a zero voltage in the other time zones. Since the pull-down resistor 4 intervenes between the negative voltage terminal 9 and the ground as shown in FIG. 1, the negative voltage terminal 9 receives the negative voltage (−V) in the transmission time while receiving the zero voltage in the others as shown in FIG. 2(b).

In short, when the switches of the controller 3 are held in, for example, the position shown in FIG. 1, the negative voltage (−V) is supplied to the gates of the FETs 102 and 104 during transmission, while the zero voltage is supplied to the same gates during the other periods. The negative voltage (−V) may be generated only when a conversation is held on the portable radio communication apparatus and when the apparatus is in a waiting state during transmission or only when a channel control signal is interchanged. The CPU 13 detects the timing of the transmission, the communication state and the waiting state and controls the negative voltage generator 12 in accordance with the detection. As a result, the difference in level between the switch control voltages is increased during transmission or the communication state and the waiting state to thereby reduce the insertion loss as shown in FIG. 2(c). Further, the current consumption of the negative voltage generator is reduced.

For example, assume that the positive voltage is 5 volt, that the negative voltage is −4 volt, that the signal frequency is 1 GHz, and that commercially available GaAs FET switches are used. Then, the illustrative embodiment improves the insertion loss by about 0.2 dB to 0.3 dB.

The embodiment has been shown and described as changing the voltage to be generated by the negative voltage generator. Alternatively, the negative voltage generator may generate a constant voltage, in which case the voltage to be supplied to the high frequency switch 1 will be changed at the controller 3 as shown in FIG. 3. FIG. 3 shows a block diagram of the controller 3. The controller 3 selects the negative, positive and zero voltage to be supplied to the high frequency switch 1 in response to the control signal from the CPU 13.

The positive voltage and the negative voltage or zero voltage are supplied during the transmission time in the manner stated above, however, the positive voltage and zero voltage are supplied, during a reception time, to the high frequency switch as switch control signals. Although this brings about a greater insertion loss during the reception time than during the transmission time, the insertion loss is sufficiently absorbed by the following circuitry in a receiving side.

Further, the positive voltage may be controlled similar to the negative voltage by the CPU.

Although the embodiment has been described with respect to a case in which the modification was based on a specific factor, it goes without saying that the present invention is not restricted to this case.

For example, while a portable radio communication apparatus usually includes a single high frequency power amplifier, it sometimes includes a plurality of high frequency power amplifiers. In such a case, the high frequency switch will be provided with a plurality of inputs and one output, and a corresponding number of voltage generators will be provided. The present invention is practicable even with this configuration.

As hitherto described, since the high frequency power amplifier implemented by a GaAs FET needs a negative voltage generator, the negative voltage generator supplies a negative voltage to a high frequency switch, too. Hence, a positive voltage and the negative voltage can be supplied to the high frequency switch as switch control signals without an exclusive negative voltage generator for the high frequency switch. This allows a great difference in level to be easily achieved and, therefore, realizes a further decrease in insertion loss. Consequently, the apparatus which uses the signal processing circuit for switch of the present invention increases conversation time and decreases weight.

Although the negative voltage may be constantly supplied to the high frequency switch, the negative voltage may be provided to the high frequency switch during a transmission time or a conversation time and a waiting time for the transmission in order to reducing a current consumption.

Furthermore, when the high frequency power amplifier is implemented by a GaAs FET, the efficiency thereof is increased. In addition, the high frequency switch using GaAs FETs contributes a great deal to the increase in conversation time and the decrease in weight due to the low current consumption and low ON resistance particular thereto.

What is claimed is:

1. A signal processing circuit for a switch comprising:
   a switch having a plurality of routes to pass a signal; and
   a first controller, to select one of the routes, for supplying a positive voltage and a negative voltage as switch control signals to said switch in response to a control signal.

2. The circuit as claimed in claim 1, said circuit further comprising:
   at least one amplifier, supplied with the negative voltage and the positive voltage, for supplying an amplified signal to said switch;
   at least one negative voltage generator for generating the negative voltage;
   at least one positive voltage generator for generating the positive voltage; and
   a second controller for supplying the control signal to said first controller.

3. The circuit as claimed in claim 1, wherein said first controller supplies either the negative voltage or a zero voltage selectively to said switch in response to the control signal applied by said second controller.

4. The circuit as claimed in claim 3, wherein said first controller is capable of supplying the negative voltage during a communication state or the zero voltage during a state other than the communication state.

5. The circuit as claimed in claim 3, wherein said first controller is capable of supplying the negative voltage during either a conversation state or a waiting for transmission state, while said first controller is capable of supplying the zero voltage during a state other than the conversation state and the waiting for transmission state.

6. The circuit as claimed in claim 2, said negative voltage generator further comprising:
   a zero voltage generator for generating a zero voltage in response to the control signal from said second controller.

7. The circuit as claimed in claim 6, wherein said negative voltage generator supplies the negative voltage during a communication state or the zero voltage during a state other than the communication state.

8. The circuit as claimed in claim 6, wherein said negative voltage generator is capable of supplying the negative voltage during a conversation state and a waiting for transmission state, or the zero voltage during a state other than the conversation state and waiting for transmission state.

9. The circuit as claimed in claim 1, wherein said switch comprises GaAs FETs.

10. The circuit as claimed in claim 2, wherein said amplifier comprises a GaAs FET.

11. The circuit as claimed in claim 9, wherein said switch comprises:
    a plurality of switching transistors, responsive to the switch control signals to gates thereof, for selectively passing the signal;
    a plurality of terminating transistors connected between said plurality of switching transistors and a ground, and responsive to switch control signals to gates thereof and the positive voltage to the sources thereof; and
    a plurality of capacitors connected between said source of said terminating transistors and the ground.

12. A signal processing circuit for a switch of a communication apparatus comprising:
    amplifying means for supplying amplified signals;
    switch having a plurality of routes to pass said amplified signals;
    positive voltage generating means for generating a positive voltage and supplying said positive voltage to said amplifying means and said switch;
    second voltage generating means for generating either a negative voltage or a zero voltage and supplying said voltage to said amplifying means and said switch;
    first control means, to select one of said routes of said switch, for selectively supplying said positive voltage and said negative voltage as switch control signals to said switch in response to a first control signal; and
    second control means for supplying said first control signal to said first control means.

13. The circuit as claimed in claim 12, wherein said positive voltage generating means supplies the positive voltage to said amplifying means and said switch selectively in response to said first control means.

14. A method for controlling a signal processing circuit for a switch, the method comprising the steps of:
    (a) switching between a plurality of routes to pass a signal therethrough; and
    (b) selecting one of said routes by supplying a first normally positive voltage and a second voltage to said switch as switch control signals in response to a control signal.

15. The method for controlling said circuit as claimed in claim 14, the method further comprising the steps of:
    (c) selectively supplying between a negative voltage and a zero voltage as said second voltage.

16. A method for controlling a signal processing circuit in a communication apparatus, the method comprising:
    (a) amplifying one or more input signals to generate one or more amplified input signals;
    (b) switching between a plurality of routes for passage of said amplified input signals;
    (c) selecting between said routes according to a switch control signal applied thereto, wherein a positive voltage is supplied to one or more of said routes while a second voltage is applied to the other of said routes.

17. The method for controlling said circuit as claimed in claim 16, wherein said switch control signal selectively supplies either a zero voltage or a negative voltage to said second voltage.

* * * * *